United States Patent
Chang et al.

(10) Patent No.: US 12,193,221 B2
(45) Date of Patent: Jan. 7, 2025

(54) SEMICONDUCTOR STRUCTURE AND METHOD FOR FORMING THE SAME

(71) Applicant: Winbond Electronics Corp., Taichung (TW)

(72) Inventors: Wei-Che Chang, Taichung (TW); Kai Jen, Taichung (TW); Yu-Po Wang, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 579 days.

(21) Appl. No.: 17/340,507

(22) Filed: Jun. 7, 2021

(65) Prior Publication Data

US 2021/0398985 A1 Dec. 23, 2021

(30) Foreign Application Priority Data

Jun. 18, 2020 (TW) .................................. 109120644

(51) Int. Cl.
*H10B 12/00* (2023.01)
(52) U.S. Cl.
CPC ........... *H10B 12/50* (2023.02); *H10B 12/053* (2023.02); *H10B 12/09* (2023.02); *H10B 12/34* (2023.02)
(58) Field of Classification Search
CPC ...... H10B 12/50; H10B 12/053; H10B 12/09; H10B 12/34; H01L 29/0642; H01L 29/0649; H01L 21/76224; H01L 21/76229; H01L 21/76232; H01L 21/762; H01L 21/823481; H01L 21/823878
See application file for complete search history.

(56) References Cited

U.S. PATENT DOCUMENTS

| 6,593,207 | B2 | 7/2003 | Hong et al. | |
| 6,596,607 | B2 | 7/2003 | Ahn | |
| 8,936,995 | B2 | 1/2015 | Tilke et al. | |
| 2002/0076900 | A1* | 6/2002 | Park | H01L 21/76229 438/424 |
| 2009/0189246 | A1* | 7/2009 | Wu | H01L 21/76224 257/E21.546 |
| 2017/0263503 | A1* | 9/2017 | Bi | H01L 21/823821 |

OTHER PUBLICATIONS

An Office Action (dated May 16, 2023) and Search Report (dated May 10, 2023) in corresponding CN Application No. 202010715585.0 are attached, 5 and 2 pages respectively.

* cited by examiner

*Primary Examiner* — Sophia T Nguyen
*Assistant Examiner* — John Lin
(74) *Attorney, Agent, or Firm* — Muncy, Geissler, Olds & Lowe, P.C.

(57) ABSTRACT

A semiconductor structure includes a semiconductor substrate and an isolation structure disposed in the semiconductor substrate. The isolation structure includes a lining layer disposed along a boundary between the semiconductor substrate and the isolation structure, a first oxide fill layer disposed over the lining layer, a dielectric barrier structure surrounding the first oxide fill layer in a closed loop, and a second oxide fill layer disposed over the dielectric barrier structure and adjacent to the lining layer.

10 Claims, 9 Drawing Sheets

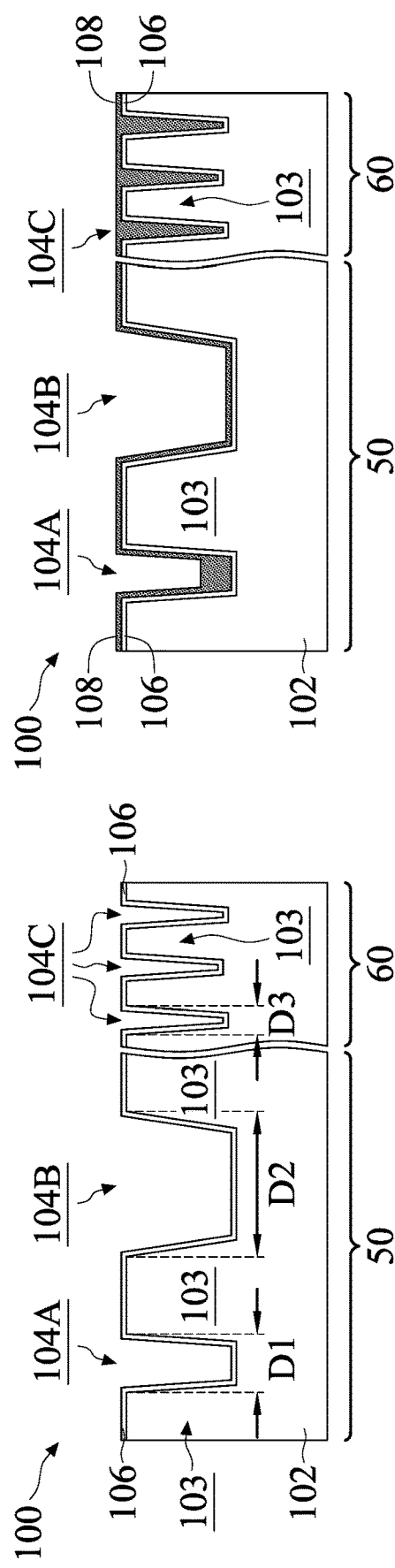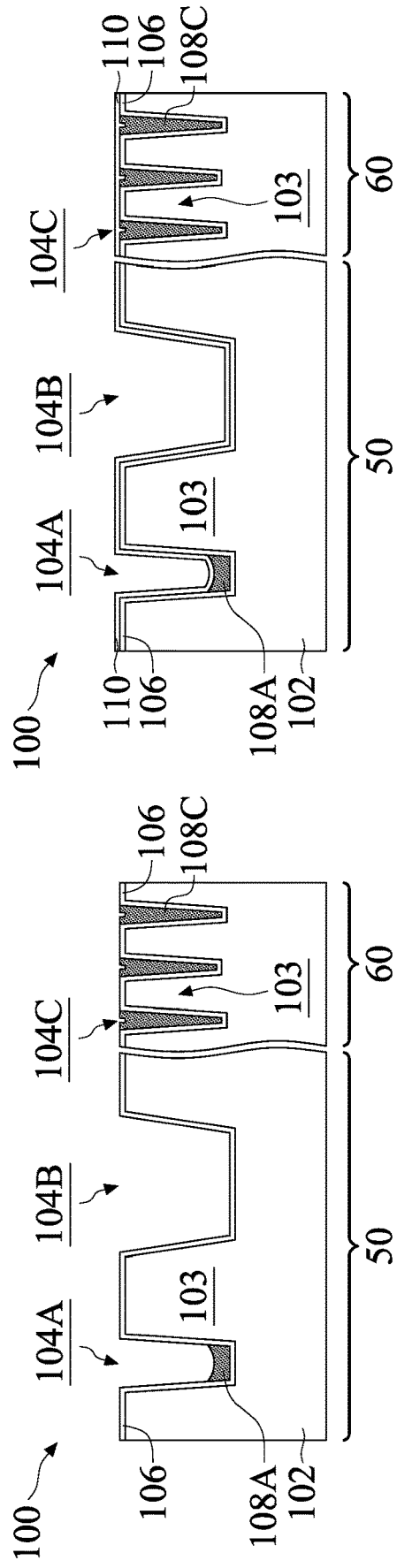

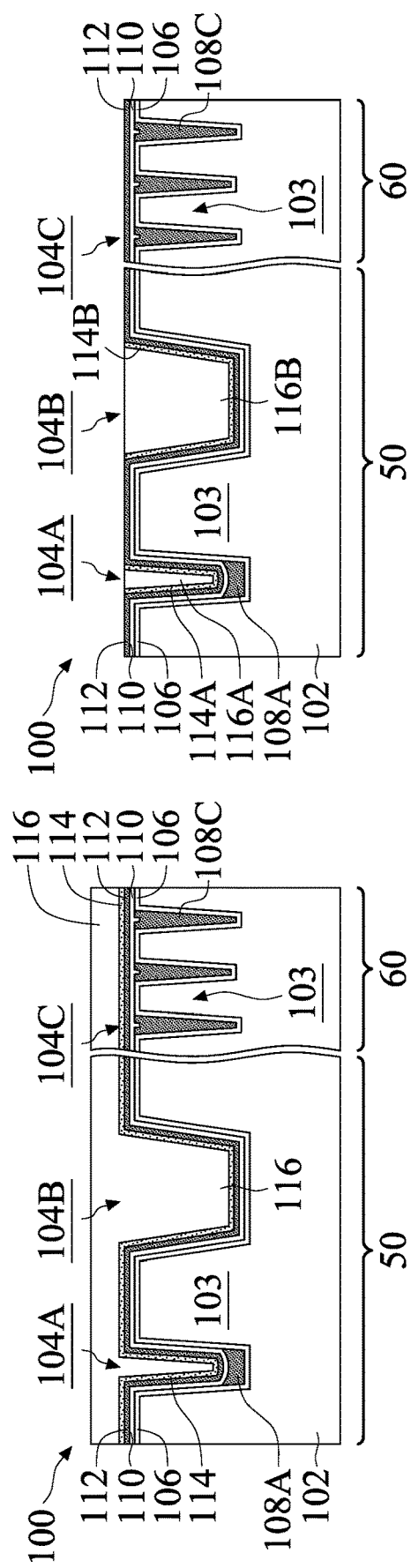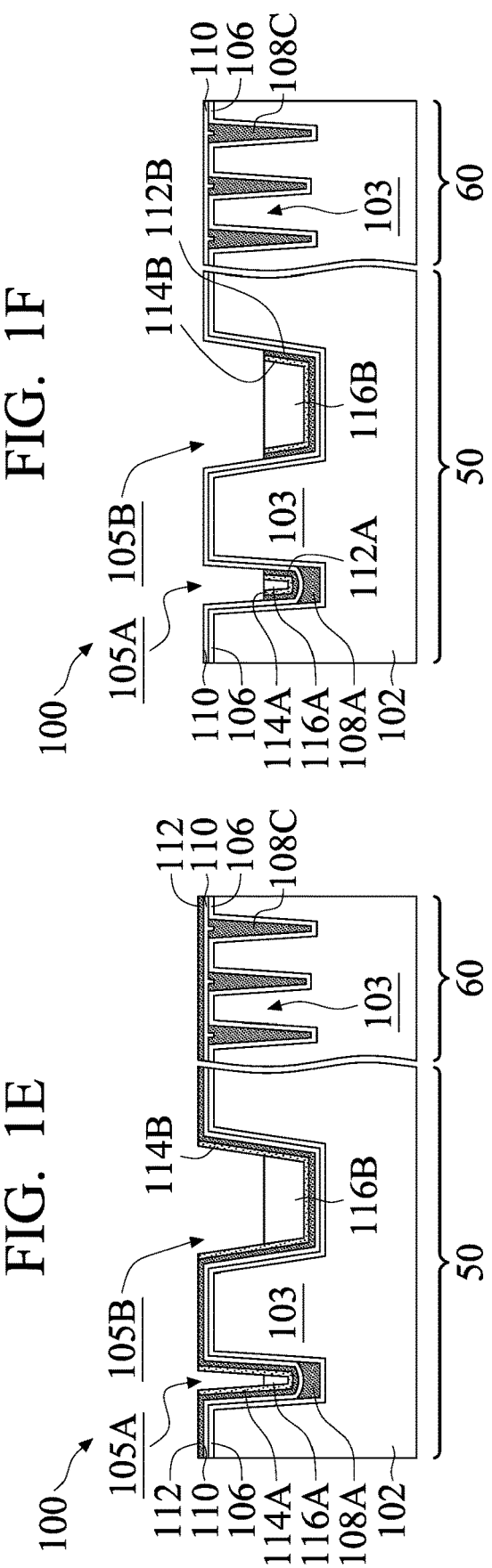

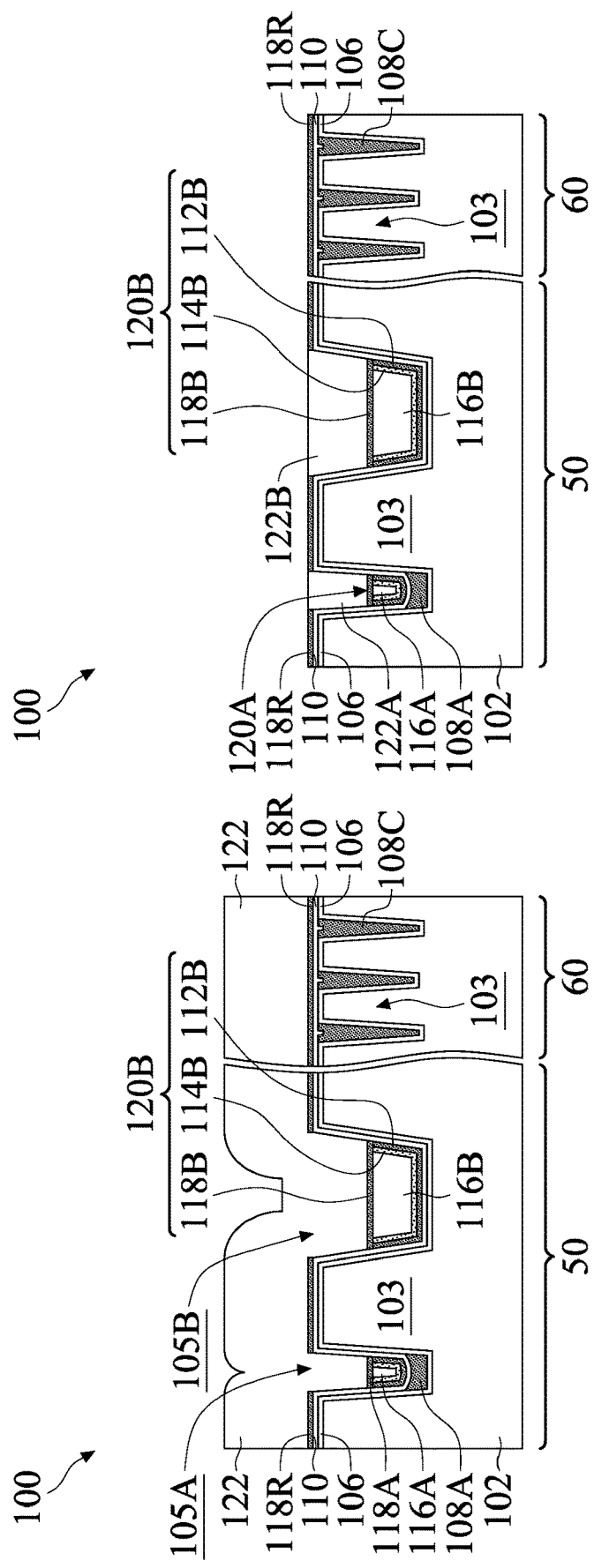

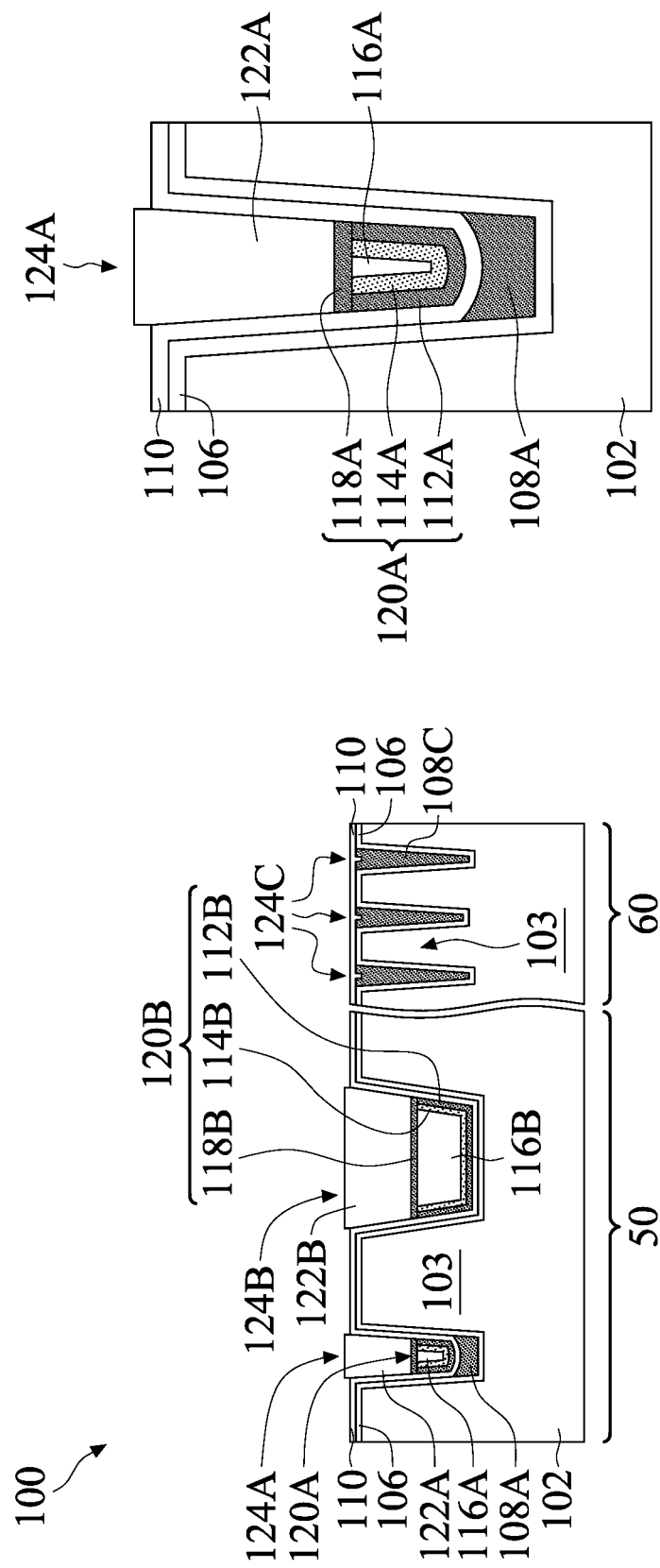

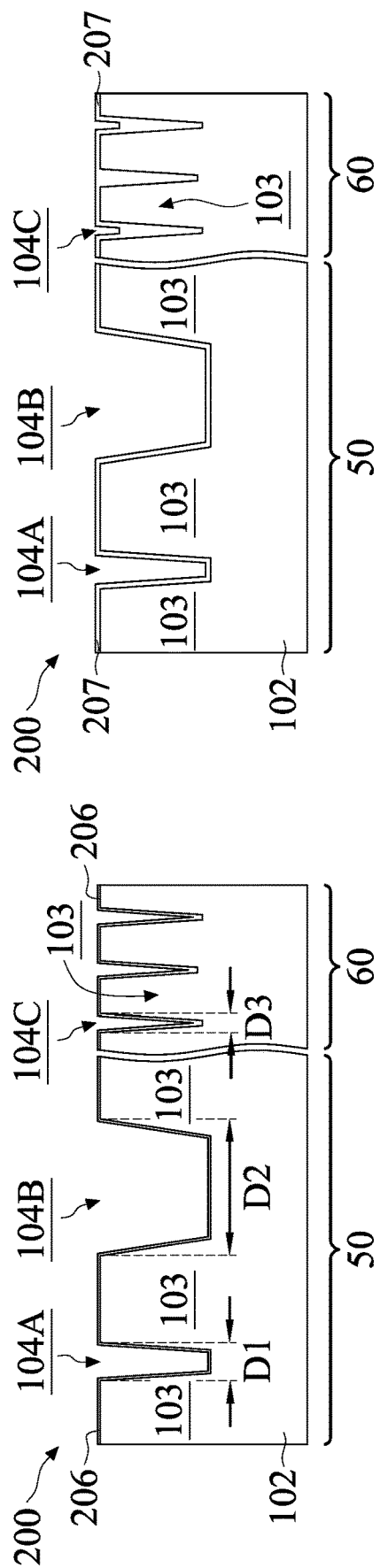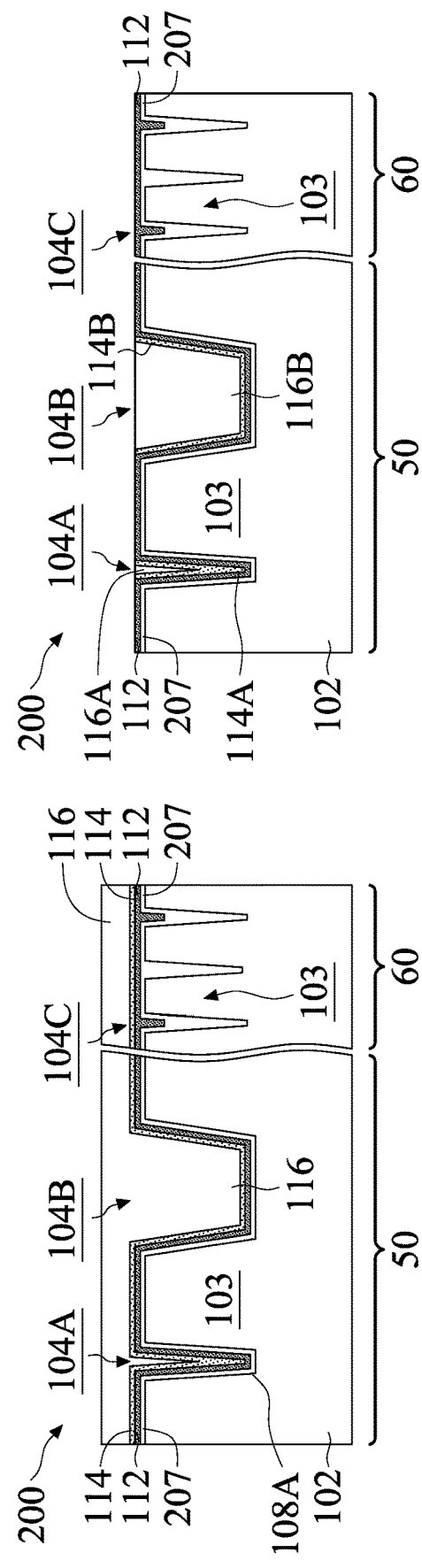

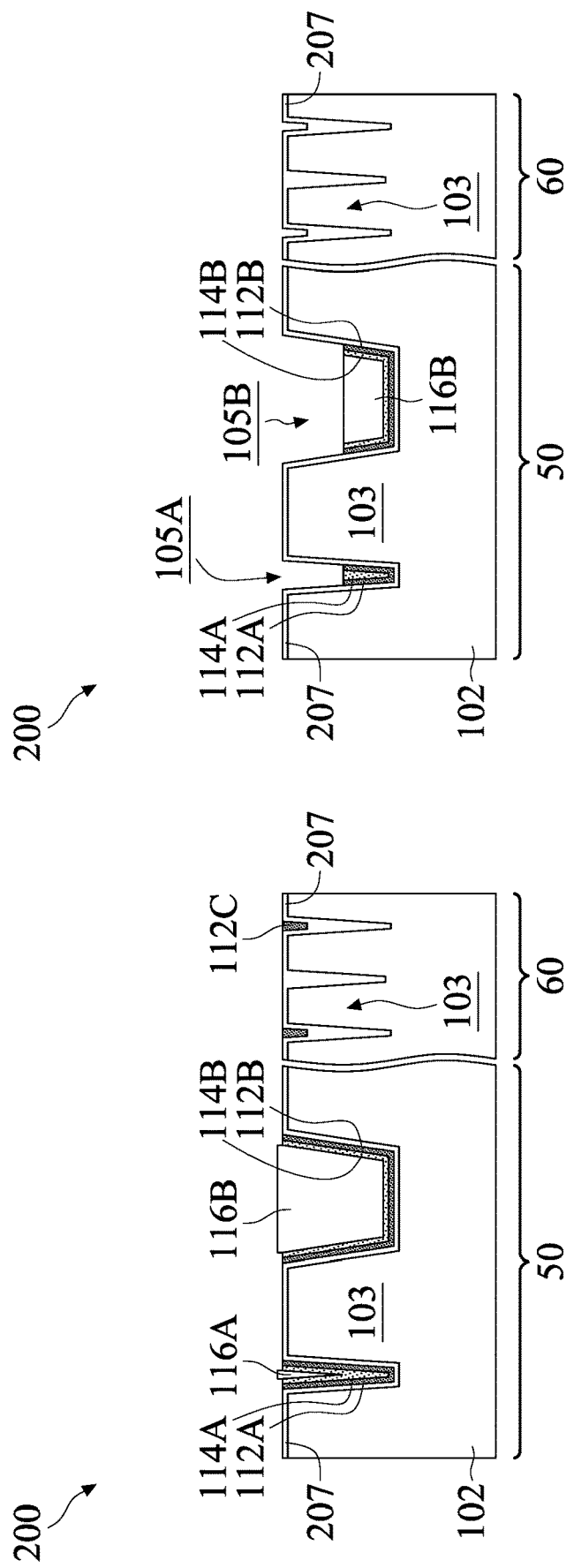

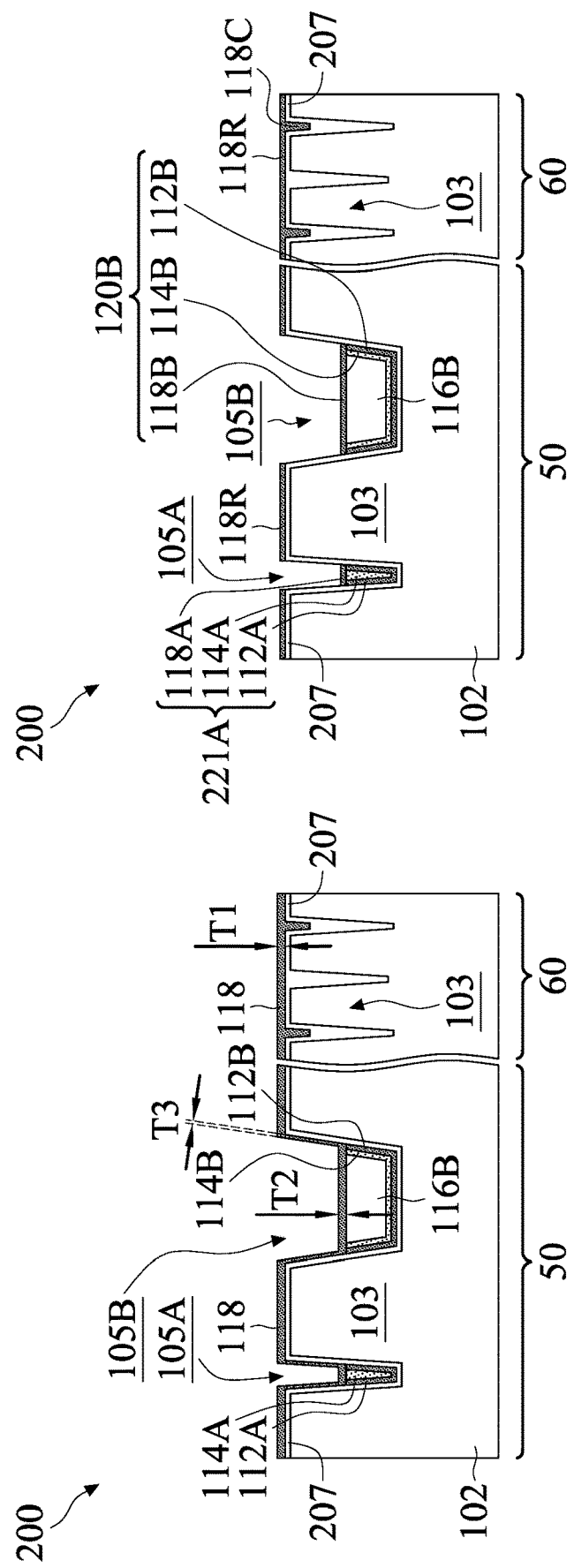

SEMICONDUCTOR STRUCTURE AND METHOD FOR FORMING THE SAME

CROSS REFERENCE TO RELATED APPLICATIONS

This application claims the benefit of Taiwan Patent Application No. 109120644 filed on Jun. 18, 2020, entitled "SEMICONDUCTOR STRUCTURE AND METHOD FOR FORMING THE SAME" which is hereby incorporated herein by reference.

BACKGROUND

Field of the Disclosure

The present disclosure relates to a semiconductor structure, and in particular, it relates to a semiconductor structure having an isolation structure.

Description of the Related Art

The semiconductor industry continues to improve the integration density of various electronic components by continual reductions in minimum feature size, which allow more components to be integrated into a given area. However, as the minimum features sizes are reduced, additional problems arise that should be addressed.

SUMMARY

In some embodiments of the disclosure, a semiconductor structure is provided. The semiconductor includes a semiconductor substrate and an isolation structure disposed in the semiconductor substrate. The isolation structure includes a lining layer disposed along a boundary between the semiconductor substrate and the isolation structure, a first oxide fill layer disposed over the lining layer, a dielectric barrier structure surrounding the first oxide fill layer in a closed loop, and a second oxide fill layer disposed over the dielectric barrier structure and adjacent to the lining layer.

In some embodiments of the disclosure, a semiconductor structure is provided. The semiconductor structure includes a semiconductor substrate and an isolation structure disposed in the semiconductor substrate. The isolation structure includes a nitride fill layer, a first oxide fill layer disposed over the nitride fill layer, a dielectric barrier structure surrounding the first oxide fill layer in a closed loop, and a second oxide fill layer disposed over the dielectric barrier structure.

In some embodiments of the disclosure, a method for forming a semiconductor structure is provided. The method includes forming a first trench in a semiconductor substrate, and forming a first nitride layer along a sidewall and a bottom surface of the first trench. The method also includes forming a first oxide layer over the first nitride layer to fill the first trench, and recessing the first oxide layer from the first trench to form a first recess. The method also includes etching a portion of the first nitride layer exposed from the first recess, and forming a second nitride layer along a sidewall and a bottom surface of the first recess. The second nitride layer includes a first portion along the bottom surface of the first recess and a second portion along the sidewall of the first recess. The method also includes removing the second portion of the second nitride layer, and forming a second oxide layer over the first portion of the second nitride layer to fill the first recess.

BRIEF DESCRIPTION OF THE DRAWINGS

The present disclosure can be further understood by reading the subsequent detailed description and examples with references made to the accompanying drawings, wherein:

FIGS. 1A-1M illustrate cross-sectional views of forming a semiconductor structure at various stages in accordance with some embodiments of the present disclosure.

FIG. 1J-1 is a portion of the semiconductor structure of FIG. 1J to illustrate additional details of the semiconductor structure, in accordance with some embodiments of the present disclosure.

FIG. 1M-1 is a portion of the semiconductor structure of FIG. 1M to illustrate additional details of the semiconductor structure, in accordance with some embodiments of the present disclosure.

FIGS. 2A-2J illustrate cross-sectional views of forming a semiconductor structure at various stages in accordance with some embodiments of the present disclosure.

DETAILED DESCRIPTION

Figures 1, 1J:
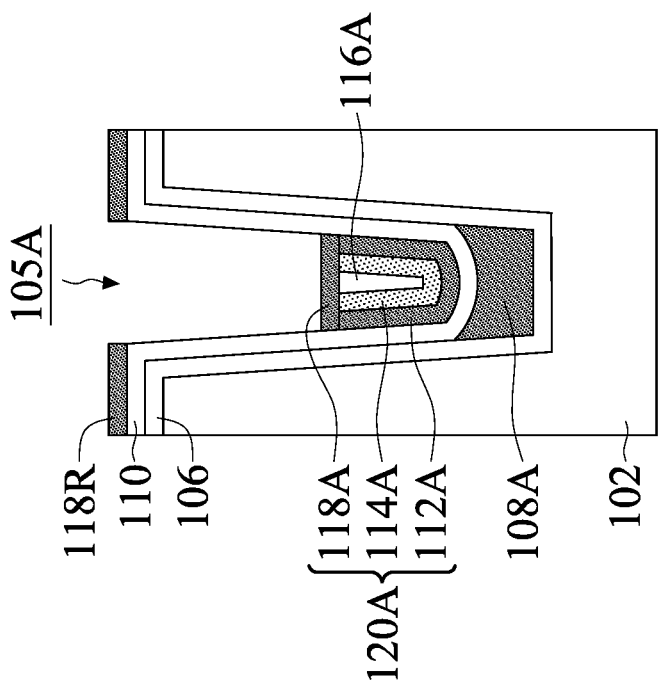

FIGS. 1A-1M illustrates cross-sectional views of forming a semiconductor structure at various stages in accordance with some embodiments of the present disclosure.

A semiconductor structure 100 is provided, as shown in FIG. 1A, in accordance with some embodiments. The semiconductor substrate 102 includes various device regions such as a peripheral circuitry region 50 and a memory cell array region 60, in accordance with some embodiments. Memory cells are to be formed in the memory cell array region 60 and are operable as data storage. Peripheral circuitry devices are to be formed in the peripheral circuitry region 50 and are operable to access and/or control (e.g. performs read/write/erase operation) the memory cells in the memory cell array region 60, in accordance with some embodiments.

Trenches 104A, 104B and 104C are formed in the semiconductor substrate 102 to define active regions 103 in the semiconductor substrate 102. The active regions 103 are used to form source/drain regions and channel regions of transistors. The trench 104A and trench 104B are formed in the peripheral circuitry region 50, and the trench 104C is formed in the memory cell array region 60.

The trenches 104A, 104B and 104C extend downward from the upper surface of the semiconductor substrate 102 a depth. In some embodiments, the depths of the trenches 104A, 104B and 104C are in a range from about 200 nm to about 400 nm.

The formation of the trenches 104A, 104B and 104C includes forming a patterned mask layer (not shown) over the upper surface of the semiconductor substrate 102, and etching the semiconductor substrate 102 using the patterned mask layer to remove portions of the semiconductor substrate 102 uncovered by the patterned mask layer.

The trench 104A has a width D1 at the top of the trench 104A, for example, the width D1 is in a range from about 50 nm to about 450 nm. The trench 104B has a width D2 at the top of the trench 104B, for example, the width D2 is in a range from about 50 nm to about 450 nm. The trench 104C has a width D3 at the top of the trench 104C, for example, the width D3 is in a range from about 10 nm to about 50 nm. The width D2 of the trench 104B is greater than the width D1 of the trench 104A, and the width D1 of the trench 104A is greater than the width D3 of the trench 104C.

The sidewalls of the trenches 104A, 104B and 104C (i.e., the side surface of the semiconductor substrate 102 exposed from the trenches 104A, 104B and 104C) have extending directions perpendicular or substantially perpendicular the main surface (e.g., the upper surface) of the semiconductor substrate 102. For example, the angle between the extending directions of the sidewalls of the trenches 104A, 104B and 104C and a horizontal direction along the upper surface of the semiconductor substrate 102, at the side close to the semiconductor substrate 102, is in a range from about 90 degrees to about 110 degrees.

A lining layer 106 is formed over the semiconductor structure 100. The lining layer 106 is formed along the sidewalls and the bottom surfaces of the trenches 104A, 104B and 104C and conforms to the profiles of the sidewalls and the bottom surfaces of the trenches 104A, 104B and 104C. In some embodiments, the thickness of the lining layer 106 over the upper surface of the semiconductor substrate 102 is in a range from about 5 nm to about 20 nm.

The lining layer 106 is made of oxide such as silicon oxide ($SiO_2$). A portion of the semiconductor substrate 102 is oxidized using in-situ steam generation (ISSG) process to form the lining layer 106. The lining layer 106 may be formed using chemical vapor deposition (CVD) process and/or atomic layer deposition (ALD) process. In some embodiments, the lining layer 106 is configured to restore crystal defects on the exposed surface of the semiconductor substrate 102 due to the etching process.

A nitride layer 108 is formed over the lining layer 106, as shown in FIG. 1B. The nitride layer 108 covers and extends along the lining layer 106 over the upper surface of the semiconductor substrate 102. The nitride layer 108 partially fills the trenches 104A and 104B and overfills the trench 104C. Because the trench 104B has a greater width D2, the nitride layer 108 in the trench 104B is formed along the lining layer 106 and conforms to the profiles of the sidewalls and the bottom surface of the trench 104B. Because the trench 104C has a smaller width D3, the nitride layer 108 is formed to entirely fill the trench 104C. Because the trench 104A had a width D1 between the thickness D2 of the trench 104B and the thickness D3 of trench 104C, the nitride layer 108 in the trench 104A is formed along the lining layer 106 to fill a lower portion of the trench 104A while an upper portion of the trench 104A remains not entirely filled by the nitride layer 108. The nitride layer 108 conforms to the profiles of the sidewalls of the upper portion of the trench 104A. In some embodiments, the thickness of the nitride layer 108 over the upper surface of the semiconductor substrate 102 is in a range from about 10 nm to about 40 nm. The nitride layer 108 is made of silicon nitride (SiN).

A pull-back process is performed on the semiconductor structure 100. The pull-back process removes portions of the nitride layer 108 over the upper surface of the semiconductor substrate 102 and portions of the nitride layer 108 conforming to the trench 104A and trench 104B until the lining layer 106 is exposed, as shown in FIG. 1C. The pull-back process is an etching process such as wet etching which may use hot phosphoric acid as etchant. After the pull-back process, portions of the lining layer 106 over the upper surface of the semiconductor substrate 102 and along the sidewalls of the upper portion of the trench 104A and along the trench 104B are exposed.

After the pull-back process, a portion of the nitride layer 108 remaining in the trench 104A is referred to as a nitride fill layer 108A. The thickness of the nitride fill layer 108A may be adjusted by controlling the parameters of the etching process (e.g., time). In some embodiments, the thickness of the nitride fill layer 108A is about 20% to about 50% of the depth of the trench 104A. In some embodiments. the upper surface of the nitride fill layer 108A has a concave profile. The portion of the nitride layer 108 conforming to the trench 104B is entirely removed. After the pull-back process, the nitride layer 108 still almost entirely fills the trench 104C. A portion of the nitride layer 108 filling in the trench 104C is referred to as a nitride fill layer 108C. In some embodiments, measured along a vertical direction, the thickness of the nitride fill layer 108C is greater than the thickness of the nitride fill layer 108A. During the pull-back process, a gap may be formed at the upper surface of the nitride fill layer 108C.

A lining layer 110 is formed over the semiconductor structure 100, as shown in FIG. 1D. The lining layer 110 in the trench 104A is formed along the lining layer 106 and the upper surface of the nitride fill layer 108A and conforms to the profiles of the sidewalls of the trench 104A and the upper surface of the nitride fill layer 108A. The lining layer 110 in the trench 104B is formed along the lining layer 106 and conforms to the profiles of the sidewalls and the bottom surface of the trench 104B. The lining layer 110 fills the gap at the upper surface of the nitride fill layer 108C. In some embodiments, the thickness of the lining layer 110 over the upper surface of the semiconductor substrate 102 is in a range from about 5 nm to about 25 nm.

The lining layer 110 is made of oxide such as silicon oxide ($SiO_2$). The lining layer 110 may be formed using CVD process and/or ALD process. In some embodiments, the lining layer 106 and the lining layer 110 both are made of silicon oxide, and there may be no obvious interface therebetween. The lining layer 106 and the lining layer 110 combine to form a lining structure and the total thickness of the lining structure along the trench may be adjusted depending on the electrical performance of the resulting device, e.g., on-current, leakage, etc.

A nitride layer 112 is formed over the lining layer 110, as shown in FIG. 1E. The nitride layer 112 in the trench 104A is formed along the lining layer 110 and conforms to the profiles of the sidewalls of the trench 104A and the upper surface of the nitride fill layer 108A. The nitride layer 112 in the trench 104B is formed along the lining layer 110 and conforms to the profiles of the sidewalls and the bottom surface of the trench 104B. In some embodiments, the thickness of the nitride layer 112 over the upper surface of the semiconductor substrate 102 is in a range from about 10 nm to about 50 nm. The nitride layer 112 is made of silicon nitride (SiN).

A nitride layer 114 is formed over the nitride layer 112. The nitride layer 114 in the trench 104A is formed along the nitride layer 112 and conforms to the profiles of the sidewalls of the trench 104A and the upper surface of the nitride fill layer 108A. The nitride layer 114 in the trench 104B is formed along the nitride layer 112 and conforms to the profiles of the sidewalls and the bottom surface of the trench 104B. In some embodiments, the thickness of the nitride layer 114 over the upper surface of the semiconductor substrate 102 is in a range from about 2 nm to about 10 nm.

The nitride layer 114 is made of silicon oxynitride (SiON). The nitride layer 114 is formed using spin-on coating process, CVD process and/or ALD process. The nitride layer 114 is configured to appropriately adhere the nitride layer 112 to a subsequently formed oxide, thereby preventing voids from being formed between the nitride layer 112 and a subsequently formed oxide. In some instance, the presence of the voids may degrade the manufacturing yield.

An oxide layer 116 is formed over the nitride layer 114 and overfills remainders of the trench 104A and the trench 104B. The oxide layer 116 is made of silicon oxide (SiO). The oxide layer 116 is formed using spin-on coating process.

A planarization process is performed on the semiconductor structure 100. The planarization process removes portions of the oxide layer 116 and the nitride layer 114 above the top of the nitride layer 112 until the nitride layer 112 is exposed, as shown in FIG. 1F. The planarization process is chemical mechanical polishing (CMP) process and the nitride layer 112 may serve as a polishing stop layer for the planarization process.

Portions of the nitride layer 114 and the oxide layer 116 remaining in the trench 104A are referred to as a nitride layer 114A and an oxide fill layer 116A, respectively; portions of the nitride layer 114 and the oxide layer 116 remaining in the trench 104B are referred to as a nitride layer 114B and an oxide fill layer 116B, respectively, as shown in FIG. 1F.

An etching process is performed on the semiconductor structure 100 to recess the oxide fill layer 116A from the trench 104A and the oxide fill layer 116B from the trench 104B, as shown in FIG. 1G. The etching process is dry etching or wet etching and may use dilute hydrofluoric (dHF) acid as etchant. The recessed oxide fill layers 116A and 116B may be adjusted to have desired thicknesses by controlling the parameters of the etching process (e.g., time). In some embodiments, measured along the vertical direction, the thickness of the oxide fill layer 116A is about 20% to about 50% of the depth D1 of the trench 104A. Measured along the vertical direction, the thickness of the oxide fill layer 116B is about 20% to about 50% of the depth D2 of the trench 104B. The thickness of the oxide fill layer 116A is less than the thickness of the oxide fill layer 116B.

During the etching process, a recess 105A is formed over the oxide fill layer 116A and a recess 105B is formed over the oxide fill layer 116B. A lower portion of the nitride layer 114A is covered by the oxide fill layer 116A and an upper portion of the nitride layer 114A is exposed from the recess 105A. A lower portion of the nitride layer 114B is covered by the oxide fill layer 116B and an upper portion of the nitride layer 114B is exposed from the recess 105B.

An etching process is performed on the semiconductor structure 100. The etching process removes portions of the nitride layers 114A and 114B and the nitride layer 112 until the lining layer 110 is exposed, thereby laterally enlarging the recesses 105A and 105B, as shown in FIG. 1H. The etching process removes portions of the nitride layer 112 over the upper surface of the semiconductor substrate 102 to exposed portions of the lining layer 110 over the upper surface of the semiconductor substrate 102. The etching process also removes the upper portions of the nitride layer 114A exposed from the recess 105A, the upper portions of the nitride layer 114B exposed from the recess 105B, and then removes the portions of the nitride layer 112 exposed from the recesses 105A and 105B such that the upper portions of the lining layer 110 conforming to the sidewalls of the upper portions of the trenches 104A and 104B are exposed. The etching process is wet etching which may use hot phosphoric acid as etchant.

A portion of the nitride layer 112 remaining in the trench 104A is referred to as a nitride layer 112A, and a portion of the nitride layer 112 remaining in the trench 104B is referred to as a nitride layer 112B, as shown in FIG. 1H.

Figure 1I:
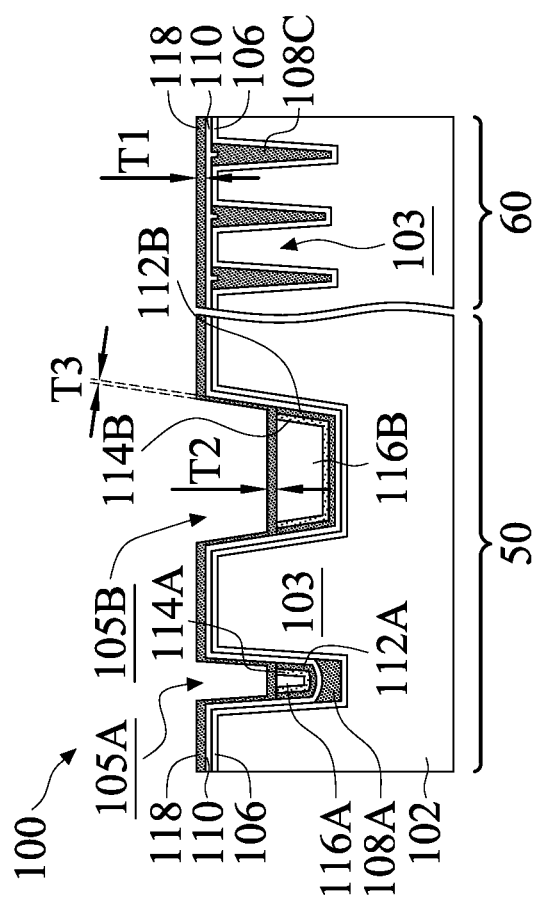
Figure 1J:
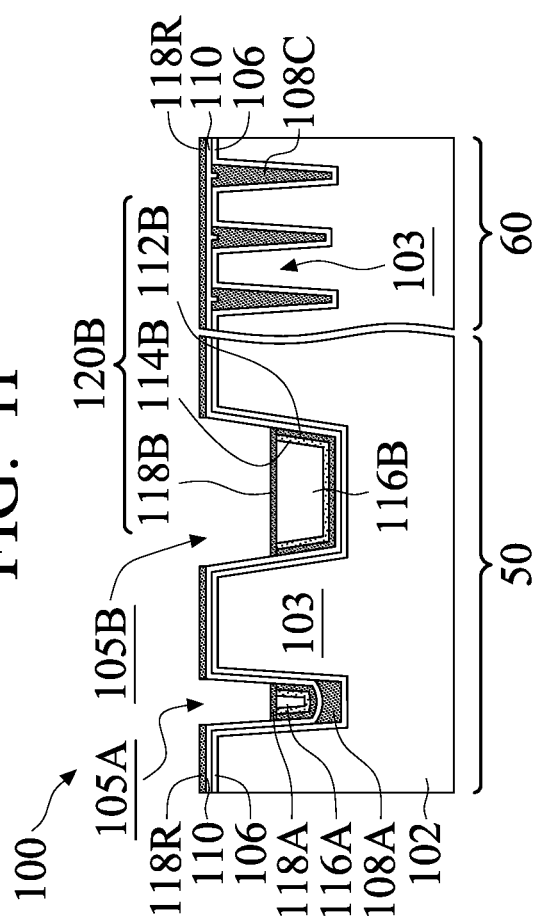

A nitride layer 118 is formed over the semiconductor structure 100, as shown in FIG. 1I. The nitride layer 118 in the recess 105A is formed along the lining layer 110 and the tops of the nitride layer 112A, the nitride layer 114A and the oxide fill layer 116A and conforms to the profiles of the sidewalls and the bottom surface of the recess 105A. The nitride layer 118 in the recess 105B is formed along the lining layer 110 and the tops of the nitride layer 112B, the nitride layer 114B and the oxide fill layer 116B and conforms to the profiles of the sidewalls and the bottom surface of the recess 105B.

The nitride layer 118 is made of silicon nitride (SiN). The nitride layer 112 is formed using physical vapor deposition (PVD) process. The nitride layer 118 formed using PVD process may have a relative low step coverage compared to the nitride layer formed using CVD or ALD process. That is, during the deposition process, the deposited rate of the nitride layer 118 along a surface which has an exactly vertically or substantially vertically extending direction is lower than the deposited rate of the nitride layer 118 along a surface which has an exactly horizontally or substantially horizontally extending direction.

A portion of the nitride layer 118 along the upper surface of the semiconductor structure 102 (also referred to as a first horizontal portion) has a first thickness T1; a portion of the nitride layer 118 along the bottom surface of the recess 105A (or the recess 105B) (also referred to as a second horizontal portion) has a second thickness T2; and a portion of the nitride layer 118 along the sidewalls of the recess 105A (or the recess 105B) (also referred to as a vertical portion) has a third thickness T3. The thickness T3 is less than the first thickness T1 and the second thickness T2. In some embodiments, the ratio of the second thickness T2 to the first thickness T1 is in a range from about 1 to about 1.05. In some embodiments, the ratio of the third thickness T3 to the second thickness T2 is in a range from about 0.05 to about 0.2.

An etching process is performed on the semiconductor structure 100 to remove portions of the nitride layer 118 until the lining layer 110 is exposed, as shown in FIG. 1J. The etching process is wet etching which may use hot phosphoric acid as etchant. The etching process also etches the horizontal portions and the vertical portions of the nitride layer 118 at the same time. The horizontal portions of the nitride layer 118 is thicker than the vertical portions of the nitride layer 118, and thus the vertical portions of the nitride layer 118 along the sidewalls of the recesses 105A and 105B are removed by the etching process to exposed the lining layer 110, while the first horizontal portion of the nitride layer 118 remains over the upper surface the semiconductor substrate 102 and the second horizontal portion of the nitride layer 118 remains over the bottom surfaces the recesses 105A and 105B.

After the etching process, the second horizontal portion of the nitride layer 118 remaining in the recess 105A is referred to as a nitride layer 118A; a second portion of the nitride layer 118 remaining in the recess 105B is referred to as a nitride layer 118B; the first portion of the nitride layer 118 remaining over the upper surface of the semiconductor substrate 102 is referred to as a nitride layer 118R.

Referring to FIG. 1J-1, which illustrates a portion of the semiconductor structure 100 of FIG. 1J to illustrate additional details of the features formed in the trench 104A. The nitride layer 112A, the nitride layer 114A and the nitride layer 118A combine to form a dielectric barrier structure 120A. The dielectric barrier structure 120A surrounds the oxide fill layer 116A in a closed loop. Because the oxide fill layer 116A formed using spin-on coating may contain more impurities which may diffuse into the active region 103, thereby degrading the performance of the resulting transistor. The dielectric barrier structure 120A is configured to block the impurities from the oxide fill layer 116A from diffusing into the active region 103, thereby improving the reliability and the manufacturing yield of the resulting semiconductor device.

If the ratio of the thickness T3 to the second thickness of the nitride layer 118 T2 is too large, the thickness of the nitride layer 118A after the etching process may be too low, or the nitride layer 118A is entirely removed, thereby reducing the ability of the dielectric barrier structure to block the impurities from the oxide fill layers 116A. If the ratio of the thickness T3 to the second thickness T2 of the nitride layer 118 is too small, the thickness of the nitride layer 118A after the etching process may be too large such that the nitride layer 118A may be too close to the active region of the device. As a result, the charges existing in the nitride layer 118A may easily have an influence on the active region.

The closed-loop profile of the dielectric barrier layer 120A includes a U-shaped lower section which is constituted of the nitride layer 112A and the nitride layer 114A and a bar-shaped upper portion which is constituted of the nitride layer 118A. The bar-shaped upper portion extends from an end of the U-shaped lower section to the other end of the U-shaped lower section. The nitride layer 112A is interfaced with the lining layer 110 and the nitride layer 11SA is interfaced with the oxide fill layer 116A. The lower section of the dielectric barrier layer 120A extends along the sidewalls and the bottom surface of the oxide fill layer 116A and the upper section of the dielectric barrier layer 120A covers the upper surface of the oxide fill layer 116A. As a result, the oxide fill layer 120 is entirely surrounded by the dielectric barrier layer 120A. The thickness of the lower section of the dielectric barrier layer 120A is greater than the upper section of the dielectric barrier layer 120A.

Referring back to FIG. 1J, the nitride layer 112B, the nitride layer 114B and the nitride layer 118B combine to form a dielectric barrier structure 120B. The dielectric barrier structure 120B surrounds the oxide fill layer 116B in a closed loop. The dielectric barrier structure 120B is configured to block the impurities from the oxide fill layer 116B from diffusing into the active region 103. The closed-loop profile of the dielectric barrier layer 120B includes a U-shaped lower section which is constituted of the nitride layer 112B and the nitride layer 114A and a bar-shaped upper portion which is constituted of the nitride layer 118B. The thickness of the lower section of the dielectric barrier layer 120B is greater than the upper section of the dielectric barrier layer 120B.

An oxide layer 122 is formed over the semiconductor structure 100 and overfills the recesses 105A and 105B, as shown in FIG. 1K. The oxide layer 122 is made of silicon oxide. The oxide layer 122 is formed using CVD process such as high density plasma CVD (HDP-CVD).

A planarization process is performed on the semiconductor structure 100. The planarization process removes portions of the oxide layer 122 above the nitride layer 118R until the nitride layer 118R is exposed. The planarization process is CMP process and the nitride layer 118R may serve as a polishing stop layer for the planarization process. A portion of the oxide layer 122 remaining in the recess 105A is referred to as an oxide fill layer 122A, and a portion of the oxide layer 122 remaining in the recess 105B is referred to as an oxide fill layer 122B.

An etching process is formed on the semiconductor structure 100 to remove the nitride layer 118R until the lining layer 110 is exposed, as shown in FIG. 1M. The etching process is wet etching which may use hot phosphoric acid as etchant. Before the etching process, a deglaze process may be performed on the semiconductor structure 100 to removes oxide remaining on the nitride layer 118R. After the etching process, in the peripheral circuitry region 50, an isolation structure 124A and an isolation structure 124B are formed in the trench 104A and the trench 104B, respectively. In the memory cell array region 60, an isolation structure 124C is formed in the trench 104C.

Referring FIG. 1M-1, which illustrates a portion of the semiconductor structure of FIG. 1M to illustrate additional details of the isolation structure 124A. The isolation structure 124A includes the lining layer 106 disposed along the boundary between the isolation structure 124A and the semiconductor substrate 102. The isolation structure 124A also includes the oxide fill layer 108A disposed over the lining layer 106. The isolation structure 124A also includes the nitride fill layer 108A over the lining layer 106. The isolation structure 124A also includes the lining layer 110 over the lining layer 106 and the nitride fill layer 108A. The lining layer 106 and the lining layer 110 combine to form a lining structure. The isolation structure 124A also includes the dielectric barrier structure 120A and the oxide fill layer 116A which are disposed over the lining layer 110. The dielectric barrier structure 120A surrounds the oxide fill layer 116A in a closed loop. The isolation structure 124A also includes the oxide fill layer 122A disposed over the dielectric barrier structure 120A and interfaced with the lining layer 110. In addition, the lining structure includes a first portion between the side surface of the semiconductor structure 102 (or the active region 103) and the sidewall of the nitride fill layer 108A; a second portion disposed between the side surface of the semiconductor structure 102 (or the active region 103) and the sidewall of the dielectric barrier structure 120A; and a third portion disposed between the upper surface of the nitride fill layer 108A and the bottom surface of the dielectric barrier structure 120A. The thickness of the second portion of the lining structure is greater than the thickness of the third portion of the lining structure.

Referring back to FIG. 1M, the isolation structure 124B includes the lining layer 106 disposed along the boundary between the isolation structure 124B and the semiconductor substrate 102 and the lining layer 110 over the lining layer 106. The isolation structure 124B also includes the dielectric barrier structure 120B and the oxide fill layer 116B over the lining layer 110. The dielectric barrier structure 120B surrounds the oxide fill layer 116B in a closed loop. The isolation structure 124B also includes an oxide fill layer 122B disposed over the dielectric barrier structure 120B and interfaced with the lining layer 110. The thickness of the oxide fill layer 116B is greater than the thickness of the oxide fill layer 116A.

The isolation structure 124C includes the lining layer 106 disposed along the boundary between the isolation structure 124C and the semiconductor substrate 102 and the nitride fill layer 108C disposed over the lining layer 106. The thickness of the nitride fill layer 108C of the isolation structure 124C is greater the thickness of the nitride fill layer 108A of the isolation structure 124A.

Additional components may be formed over the semiconductor structure 100, thereby producing a semiconductor memory device such as dynamic random access memory device, resistance random access memory device, flash memory device, etc. For example, the lining layer 106 and the lining layer 110 over the upper surface of the semiconductor substrate 102 may be removed to expose the upper surface of the active region 103. Afterward, a gate dielectric layer may be formed over the upper surface of the active region 103 and a gate electrode layer may be formed over the gate dielectric layer. For example, source/drain regions may be formed at the upper surface of the active region 103 on the opposite sides of the gate electrode layer using an ion implantation process and/or an epitaxial growth process.

The embodiments of the present disclosure provide the isolation structure 124A/124B which includes the dielectric barrier structure 120A/120B. The dielectric barrier structure 120A/120B is formed by entirely removing the portion of the nitride layer 118 on the sidewalls of the recess 105 while remaining the portion of the nitride layer 118 on the bottom surface of the recess 105. As such, the nitride layer of the dielectric barrier structure 120A/120B is far away from the upper surface of the active region 103 where a channel layer of a transistor is to be formed. Therefore, it is possible to prevent the nitride layer from trapping electrons flowing through the channel layer, thereby improving the leakage of the resulting semiconductor device. As a result, the performance of the semiconductor device may be enhanced. In addition, the dielectric barrier structure 120A/120B surrounds the oxide fill layer 116A/116B in a closed loop, which may block the impurities from the oxide fill layer 116A/116B from diffusing into the active region 103, thereby improving the reliability and the manufacturing yield of the resulting semiconductor device.

FIGS. 2A-2J illustrate cross-sectional views of forming a semiconductor structure at various stages in accordance with some embodiments of the present disclosure. Elements or layers in FIGS. 2A-2J that are the same or similar to those in FIGS. 1A-1M are denoted by like reference numerals that have the same meaning, and the description thereof will not be repeated for the sake of brevity.

A semiconductor structure 200 is provided, as shown in FIG. 2A. The semiconductor structure 200 includes a semiconductor substrate 102. Trenches 104A, 104B and 104C are formed in the semiconductor substrate 102 to define active regions 103 in the semiconductor substrate 102.

A lining layer 206 is formed over the semiconductor structure 200. The lining layer 206 is formed along the sidewalls and the bottom surfaces of the trenches 104A, 104B and 104C and conforms to the profiles of the sidewalls and the bottom surfaces of the trenches 104A, 104B and 104C. In some embodiments, the thickness of the lining layer 206 over the upper surface of the semiconductor substrate 102 is in a range from about 2 nm to about 15 nm.

The lining layer 206 is made of oxide such as silicon oxide ($SiO_2$). The lining layer 206 is formed using ALD process and/or CVD process.

A thermal treatment (such as ISSG process) is performed on the semiconductor structure 200 such that portions of the semiconductor substrate 102 are oxidized to grow the lining layer 206. The growing lining layer 206 is referred to as a lining layer 207, as shown in FIG. 2B. The lining layer 207 covers and extends along the upper surface of the semiconductor substrate 102. The lining layer 207 partially fills the trenches 104A and 104B and almost entirely fills the trench 104C. Because the trenches 104A and 104B have greater widths D1 and D2, the lining layer 207 conforms to the profiles of the sidewalls and the bottom surfaces of the trenches 104A and 104B. Because the trench 104C has a smaller width D3, the lining layer 207 is formed to almost entirely fill the trench 104C. During the thermal treatment, a gap may be formed at the upper surface of the lining layer 207 in the trench 104C. In some embodiments, the thickness of the lining layer 207 over the upper surface of the semiconductor substrate 102 is in a range from about 2 nm to about 20 nm. The thickness of the lining layer 207 may be adjusted depending on the electrical performance of the resulting device, e.g., on-current, leakage, etc.

A nitride layer 112 is formed over the lining layer 207, as shown in FIG. 2C. The nitride layer 112 in the trench 104A is formed along the lining layer 207 and conforms to the profiles of the sidewalls and the bottom surface of the trench 104A. The nitride layer 112 in the trench 104B is formed along the lining layer 207 and conforms to the profiles of the sidewalls and the bottom surface of the trench 104B. The nitride layer 112 fills the gap within the lining layer 207 in the trench 104C.

A nitride layer 114 is foamed over the nitride layer 112. The nitride layer 114 in the trench 104A is foamed along the nitride layer 112. The nitride layer 114 fills a lower portion of the trench 104A while an upper portion of the trench 104A remains not entirely filled by the nitride layer 114. The nitride layer 114 conforms to the profiles of the sidewalls of the upper portion of the trench 104A. The nitride layer 114 in the trench 104B is formed along the nitride layer 112 and conforms to the profiles of the sidewalls and the bottom surface of the trench 104B.

An oxide layer 116 is formed over the nitride layer 114 and overfills remainders of the trench 104A and the trench 104B.

A planarization process is performed on the semiconductor structure 200. The planarization process removes portions of the oxide layer 116 and the nitride layer 114 above the top of the nitride layer 112 until the nitride layer 112 is exposed, as shown in FIG. 2D. Portions of the nitride layer 114 and the oxide layer 116 remaining in the trench 104A are referred to as a nitride layer 114A and an oxide fill layer 116A, respectively; portions of the nitride layer 114 and the oxide layer 116 remaining in the trench 104B are referred to as a nitride layer 114B and an oxide fill layer 116B, respectively.

An etching process is performed on the semiconductor structure 200 to remove portions of the nitride layer 112 over the upper surface of the semiconductor substrate 102 to expose a portion of the lining layer 207 over the upper surface of the semiconductor substrate 102, as shown in FIG. 2E. The etching process is wet etching which may use hot phosphoric acid as etchant. A portion of the nitride layer 112 remaining in the trench 104A is referred to as a nitride layer 112A, and a portion of the nitride layer 112 remaining in the trench 104B is referred to as a nitride layer 112B. A portion of the nitride layer 112 remaining within the gap in the trench 104C is referred to as a gap filler 112C.

An etching process is performed on the semiconductor structure 200 to recess the oxide fill layer 116A from the trench 104A and the oxide fill layer 116B from the trench 104B, thereby forming a recess 105A and a recess 105B, as shown in FIG. 2F. The etching process entirely removes the oxide fill layer 116A. In addition, the recessed oxide fill layer 116B may be adjusted to have desired thicknesses by controlling the parameters of the etching process (e.g., time).

An etching process is performed on the semiconductor structure 200. The etching process removes portions of the nitride layers 114A and 114B and portions of the nitride layers 112A and 112B until the lining layer 207 is exposed, thereby laterally enlarging the recesses 105A and 105B, as shown in FIG. 2F. The etching process removes the upper portion of the nitride layer 114A exposed from the recess 105A and the upper portions of the nitride layer 114B exposed from the recess 105B, and then removes the portions of the nitride layer 112A exposed from the recesses 105A and the portions of the nitride layer 112B exposed from the recesses 105B such that the lining layer 207 is exposed. During the etching process, the gap filler 112C is also removed, thereby forming a gap again.

A nitride layer 118 is formed over the semiconductor structure 200, as shown in FIG. 2G. The nitride layer 118 in the recess 105A is formed along the lining layer 207 and the tops of the nitride layer 112A and the nitride layer 114A and conforms to the profiles of the sidewalls and the bottom surface of the recess 105A. The nitride layer 118 in the recess 105B is formed along the lining layer 110 and the tops of the nitride layer 112B, the nitride layer 114B and the oxide fill layer 116B and conforms to the profiles of the sidewalls and the bottom surface of the recess 105B. The nitride layer 118 also fills the gap within the lining layer 207 in the trench 104C.

A first horizontal portion of the nitride layer 118 along the upper surface of the semiconductor structure 102 has a first thickness T1; a second horizontal portion of the nitride layer 118 along the bottom surface of the recess 105A (or the recess 105B) has a second thickness T2; and a vertical portion of the nitride layer 118 along the sidewalls of the recess 105A (or the recess 105B) has a third thickness T3. The thickness T3 is less than the first thickness T1 and the second thickness T2.

An etching process is performed on the semiconductor structure 200 to remove portions of the nitride layer 118 until the lining layer 207 is exposed, as shown in FIG. 2H. The etching process etches the horizontal portions and the vertical portion of the nitride layer 118 at the same time. The vertical portions of the nitride layer 118 along the sidewalls of the recesses 105A and 105B are removed by the etching process to exposed the lining layer 207, while the first horizontal portion of the nitride layer 118 remains over the upper surface the semiconductor substrate 102 and the second horizontal portion of the nitride layer 118 remains over the bottom surfaces the recesses 105A and 105B.

After the etching process, the second horizontal portion of the nitride layer 118 remaining in the recess 105A is referred to as a nitride layer 118A; a second portion of the nitride layer 118 remaining in the recess 105B is referred to as a nitride layer 118B; the first portion of the nitride layer 118 remaining over the upper surface of the semiconductor substrate 102 is referred to as a nitride layer 118R; and a portion of the nitride layer 118 remaining within the gap in the trench 104C is referred to as a gap filler 118C.

The nitride layer 112A, the nitride layer 114A and the nitride layer 118A combine to form a nitride fill structure 221A, as shown in FIG. 2H. The nitride layer 112B, the nitride layer 114B and the nitride layer 118B combine to form a dielectric barrier structure 120B. The dielectric barrier structure surrounds the oxide fill layer 116B in a closed loop.

Figures 2I, 2J:
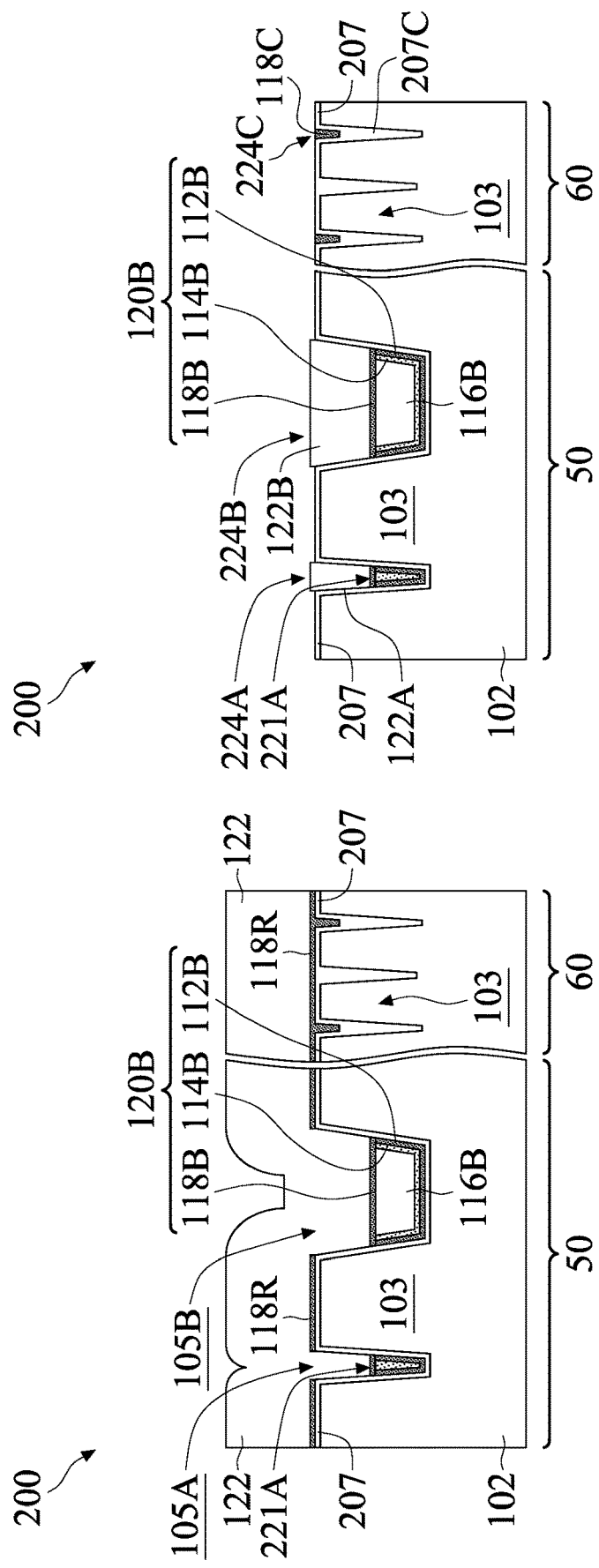

An oxide layer 122 is formed over the semiconductor structure 200 and overfills the recesses 105A and 105B, as shown in FIG. 2I.

A planarization process is performed on the semiconductor structure 200. The planarization process removes portions of the oxide layer 122 above the nitride layer 118R until the nitride layer 118R is exposed. A portion of the oxide layer 122 remaining in the recess 105A is referred to as an oxide fill layer 122A, and a portion of the oxide layer 122 remaining in the recess 105B is referred to as an oxide fill layer 122B, as shown in FIG. 2J.

An etching process is formed on the semiconductor structure 200 to remove the nitride layer 118R until the lining layer 207 is exposed. After the etching process, in the peripheral circuitry region 50, an isolation structure 224A and an isolation structure 224B are formed in the trench 104A and the trench 104B, respectively. In the memory cell array region 60, an isolation structure 224C is formed in the trench 104C.

The isolation structure 224A includes the lining layer 207 disposed along the boundary between the isolation structure 224A and the semiconductor substrate 102, the nitride fill structure 221A over the lining layer 207, and the oxide fill layer 122A over the nitride fill structure 221A. The isolation structure 224B is substantially the same as the isolation structure 124B, except for the lining layer 207. The isolation structure 224C includes the lining layer 207 (also referred to as oxide fill layer 207C) and the gap filler 118C disposed at the upper surface of the oxide fill layer 207C.

As described above, the embodiments of the present disclosure provide the isolation structure which includes the dielectric barrier structure. The nitride layer of the dielectric barrier structure is far away from the upper surface of the channel layer of the active region. Therefore, it is possible to prevent the nitride layer from trapping electrons flowing through the channel layer, thereby improving the leakage of the resulting semiconductor device. As a result, the performance of the semiconductor device may be enhanced. In addition, the dielectric barrier structure surrounds the oxide fill layer in a closed loop, which may block the impurities from the oxide fill layer from diffusing into the active region 103, thereby improving the reliability and the manufacturing yield of the resulting semiconductor device.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a semiconductor substrate; and
   an isolation structure disposed in the semiconductor substrate, wherein the isolation structure comprises:
   a lining layer disposed along a boundary between the isolation structure and the semiconductor substrate;
   a first oxide fill layer disposed over the lining layer;
   a dielectric barrier structure surrounding the first oxide fill layer in a closed loop; and
   a second oxide fill layer disposed over the dielectric barrier structure and adjacent to the lining layer,
   wherein the lining layer is in direct contact with the second oxide fill layer.

2. The semiconductor structure as claimed in claim 1, wherein the dielectric barrier structure comprises:
   a first section along an upper surface of the first oxide fill layer; and
   a second section along a sidewall of the first oxide fill layer, wherein a thickness of the second section of the dielectric barrier structure is greater than a thickness of the first section of the dielectric barrier structure.

3. The semiconductor structure as claimed in claim 2, wherein the second section of the dielectric barrier structure comprises:
   a silicon oxynitride layer; and
   a silicon nitride layer between the lining layer and the silicon oxynitride layer.

4. The semiconductor structure as claimed in claim 2, wherein the first section of the dielectric barrier structure comprises a silicon nitride layer between the first oxide fill layer and the second oxide fill layer.

5. The semiconductor structure as claimed in claim 1, further comprising:
   a second isolation structure disposed in the semiconductor substrate, wherein the second isolation structure comprises a first nitride fill layer: and
      a third isolation structure disposed in the semiconductor substrate, wherein the third isolation structure comprises a second nitride fill layer, and a thickness of the second nitride fill layer is greater than a thickness of the first nitride fill layer.

6. The semiconductor structure as claimed in claim 5, wherein the second isolation structure further comprises a third oxide fill layer disposed over the first nitride fill layer.

7. The semiconductor structure as claimed in claim 1, wherein the lining layer is made of a silicon oxide.

8. A semiconductor structure, comprising:
   a semiconductor substrate; and
   an isolation structure disposed in the semiconductor substrate, wherein the isolation structure comprises:
   a nitride fill layer;
   a first oxide fill layer disposed over the nitride fill layer;
   a dielectric barrier structure surrounding the first oxide fill layer in a closed loop;
   a second oxide fill layer disposed over the dielectric barrier structure; and
   a lining structure disposed between the semiconductor substrate and the isolation structure, wherein the lining structure is in direct contact with the second oxide fill layer.

9. The semiconductor structure as claimed in claim 8, wherein the lining structure comprises:
   a first portion disposed between a side surface of the semiconductor substrate and a sidewall of the nitride fill layer;
   a second portion disposed between the side surface of the semiconductor substrate and a sidewall of the dielectric barrier structure; and
   a third portion disposed between an upper surface of the nitride fill layer and a bottom surface of the dielectric barrier structure.

10. The semiconductor structure as claimed in claim 9, wherein a thickness of the second portion of the lining structure is greater than a thickness of the first portion of the lining structure.

* * * * *